United States Patent [19]

Kittel

[11] 3,846,713

[45] Nov. 5, 1974

[54] METHOD AND APPARATUS FOR TUNING AN AMPLIFIER CIRCUIT

[75] Inventor: Harold James Kittel, Dayton, Ohio

[73] Assignee: R. L. Drake Company, Miamisburg, Ohio

[22] Filed: Nov. 15, 1973

[21] Appl. No.: 415,928

Related U.S. Application Data

[63] Continuation-in-part of Ser. No. 261,683, June 12, 1972, abandoned.

[52] U.S. Cl. ................ 330/192, 325/174, 325/177, 333/32

[51] Int. Cl. ........................................ H03h 7/38

[58] Field of Search ........... 325/172, 174, 177, 187; 330/192, 157, 195; 333/17 M, 32

[56] References Cited

UNITED STATES PATENTS

| | | | |
|---|---|---|---|
| 2,724,804 | 11/1955 | Storch | 333/32 X |
| 3,160,832 | 12/1964 | Beitman et al. | 325/174 X |
| 3,390,337 | 6/1968 | Beitman | 325/174 |
| 3,537,010 | 10/1970 | Roza et al. | 325/174 |

*Primary Examiner*—John S. Heyman
*Attorney, Agent, or Firm*—Biebel, French & Bugg

[57] ABSTRACT

A method of adjusting a tuned circuit receiving power from an amplifier and transferring power to a load includes the steps of adjusting the amplifier power output to a low value and temporarily introducing an impedance between the amplifier and the tuned circuit, the temporary impedance approximating the proper load for the amplifier when operating at its normal power levels, adjusting the tuned circuit for maximum power output at the lower power level, removing the impedance and thereafter operating the amplifier at its normal power level.

An apparatus for performing the method includes a resistance device which is temporarily switched in parallel with the output of the amplifier, the resistance approximating the proper load impedance for the amplifier when operating at its normal power level, and means for reducing the power level of the amplifier, by lowering the screen voltage, for example, and adjusting the tuned circuit for maximum power output as indicated by an output power detector. The output power detector may include an audio frequency device which produces an audible output signal, the frequency of which is a function of the output power level.

8 Claims, 4 Drawing Figures

METHOD AND APPARATUS FOR TUNING AN AMPLIFIER CIRCUIT

RELATED APPLICATION

This application is a continuation-in-part of application Ser. No. 261,683, filed June 12, 1972, now abandoned.

BACKGROUND OF THE INVENTION

This invention relates to a method of adjusting a tuned circuit which receives power from an amplifier and which transfers power to a load and an apparatus for performing the method. More specifically, the invention relates to a method and apparatus for tuning a final amplifier of a radio frequency transmitter, such as a single band transmitter for amateur or military use, where the frequency of the output of the transmitter may be changed from time to time within a wide range of frequencies, and accomplishing this tuning with the amplifier adjusted to a low power level.

In the tuning of a final amplifier in a radio frequency transmitter, and particularly transmitters having relatively high input power levels, for example in excess of 100 watts, it is possible to damage the final amplifier as a result of excessive heat dissipation if the output tuned circuit is improperly adjusted. In the past, especially with transmitters which are capable of operating over a wide range of frequencies, such as transmitters used in amateur and military service, tuning the final amplifier is frequently prefaced by an initial setting of the tuning controls by reference to markings on the front panel of the transmitter. The transmitter is then turned on and the tuned circuit adjusted to resonance. In the case of pi-network output tuned circuits, the circuit must not only be adjusted to resonance, but the load capacitor must also be adjusted to account for the impedance of the load (antenna). Since the load capacitor interacts with the tuning capacitor, several adjustments are required. Similarly, with link coupled tuned circuits, the position of the link must be adjusted for the proper power output which in turn affects the adjustment of the tuning capacitor. In either case, a relativly long period of time is required to obtain proper tuning of the amplifier.

In the case of amplifiers having high output power levels, the time required to tune the amplifier properly may exceed the capacity of the amplifier to dissipate heat, resulting in damage thereto. Also, the length of time required to tune the transmitter is not usually used for communication purposes and therefore an unnecessary radio frequency signal is often placed on the air, merely for the purpose of adjusting the transmitter. This is particularly annoying in crowded amateur bands.

In some prior art transmitters, the power level of the output or final amplifier may be adjusted by a separate control which controls the drive to the final amplifier, especially where the amplifier is of linear design. In other prior art transmitters, the screen voltage of the final amplifier may be adjusted to control the power output with the screen voltage being lowered to lower the output power for tuning purposes. However, the optimum load impedance for the amplifier is a function of its power level and therefore when the transmitter is tuned at a lower power level, the tuned circuit will be adjusted for the optimum load impedance at that power level, and when the transmitter power is subsequently raised to its normal operating level, the tuned circuit will be misadjusted. Optimum load impedance means the load impedance which provides the optimum characteristics desired, such as maximum power output, lowest distortion, etc. Although tuning the transmitter to provide maximum power output with the amplifier operating at a lower power level will generally bring the tuned circuit in close proximity to proper adjustment initially, further tuning will be required when the amplifier is operated at full power since the optimum load impedance at the higher power level will be different.

SUMMARY OF THE INVENTION

This invention relates to a method and apparatus whereby a transmitter may be tuned at a low power level while maintaining a proper impedance relationship between the final amplifier and the tuned circuit output when the amplifier power level is subsequently raised.

The method includes the steps of lowering the output power level of the amplifier, thus changing the amplifier's characteristics, and introducing a temporary impedance between the amplifier and a tuned circuit. This temporary impedance is approximately equal to the optimum load impedance for the amplifier when operated at its normal power level. The tuned circuit is then adjusted for maximum power output at the lower power level. The power output level may be measured by conventional means, such as a relative power meter or RF ammeter connected between the tuned circuit and the load, or it may be measured by an audio frequency device, the frequency of which is a function of power level. This latter device is particularly useful to a blind person operating the transmitter or when tuning the transmitter in low ambient light conditions.

Since the tuned circuit is adjusted to the frequency of the amplifier, and the impedance supplying power to the tuned circuit is the same as the optimum load impedance for the amplifier when operating at its normal power level, no further adjustment of the tuned circuit will be necessary when the temporary impedance is removed and the amplifier thereafter operated at its normal power level. Of course, the impedance of the load, usually an antenna, does not normally change during this procedure since it is not a function of power level.

By tuning the amplifier at a low level of power, there is less danger in damaging the final amplifier due to excessive heat dissipation and the signal which is placed on the air is of such a low magnitude that it is unlikely to cause any substantial interference. The circuit of this invention therefore provides for rapid tuneup, ease of tuning for the blind or in low ambient light conditions, less likelihood of damage to the amplifier, and a reduction in radio frequency interference during tuning.

Since the amplifier is not required to run at a full duty cycle, even during tuning, and since the duty cycle for single side band speech is small compared to either AM, FM or CW, a transmitter incorporating this low power tuning feature may be constructed from less expensive and lower power final amplifier devices. For example, a transmitter operating at 500 watts PEP single side band requires a final amplifier tube capable of operating at only 50 watts, continuous output.

Other objects and advantages of the invention will be apparent from the following description, the accompanying drawings and the appended claims.

DESCRIPTION OF THE PREFERRED EMBODIMENT

Figure 1:
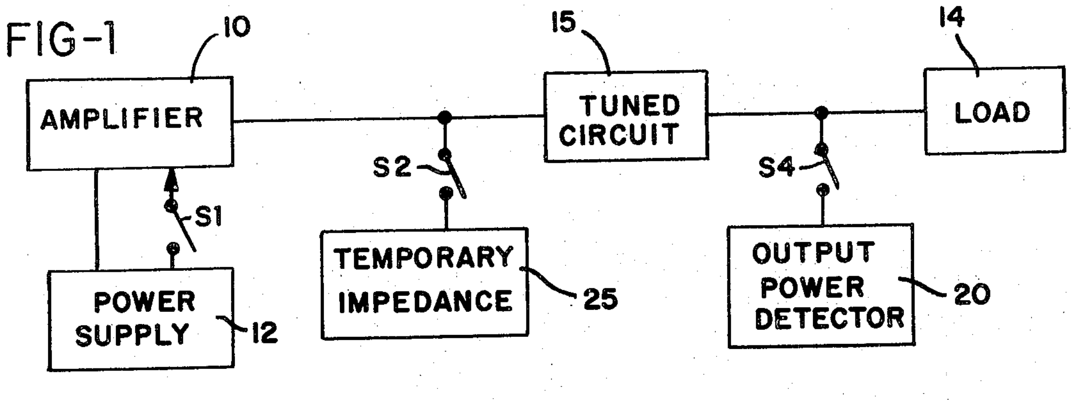
FIG. 1 is an electrical block diagram of the invention.

Referring now to the drawings which show a preferred embodiment of the invention, and particularly to FIG. 1 which is a block diagram of the invention, an amplifier 10 is supplied with power from a power supply 12. The power supply 12 is capable, by means of a switch S1, of reducing the power of the amplifier to a fraction of its normal operating power. The output of the amplifier 10 is applied to a load 14 through a tuned circuit 15. The tuned circuit 15, as will be explained, is adjusted to present to the amplifier 10 the proper resistance transformed from the load 14. The output power to the load 14 may be monitored by an output power meter 20 thereby to assist the operator in properly adjusting the tuned circuit 15.

Interposed between the amplifier 10 and the tuned circuit 15 when the amplifier power level is reduced is a temporary impedance 25. The purpose of the temporary impedance 25 is to provide a low impedance source of power for the tuned circuit 15. The temporary impedance is therefore selected to present to the tuned circuit an impedance which approximates the proper load impedance for the amplifier when operating normally.

In operation, the amplifier is first adjusted to a low power level by means of switch S1. The temporary impedance 25 is connected across the output of the amplifier by means of switch S2 to provide a low impedance source for the tuned circuit 15. The tuned circuit 15 is then adjusted for maximum power transfer to load 14 as indicated by the output power detector 20.

Once the tuning is completed, the power level of the amplifier 10 is returned to its normal level, the temporary impedance removed and the circuit operated normally without requiring any additional retuning since the tuned circuit 25 now presents the proper impedance to the amplifier and the load 14 is unchanged.

Figure 2:
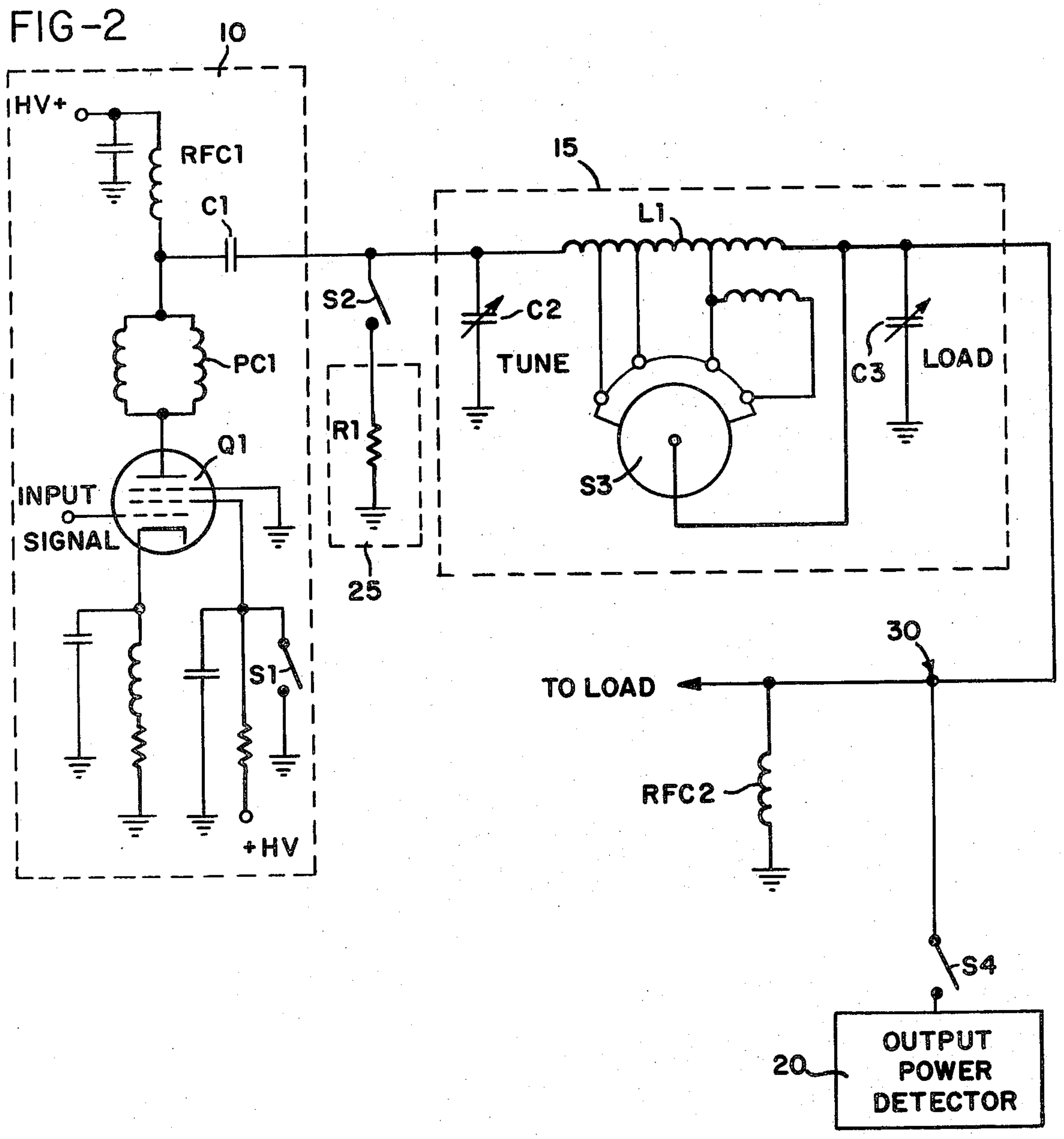
FIG. 2 is an electrical schematic diagram showing the invention.

Reference is now made to FIG. 2 where it may be seen that the amplifier 10 includes a pentode power amplifier vacuum tube Q1. The power output of the amplifier is a function of its screen voltage, and the screen voltage is adjusted during initial tuneup to a substantially lower value than when operating at normal power by means of switch S1. The anode of the final amplifier Q1 is connected to a source of high voltage through a parasitic choke PC1 and radio frequency choke RFC1. A coupling capacitor C1 interconnects the anode of Q1 with the tuned circuit 15.

A pi-network tuned circuit 15 is shown in FIG. 2 and includes an inductor L1 which is tapped at several points and connected to a switch S3 so that the transmitter may be operated over a wide range of frequencies. The circuit 15 is tuned by means of a variable capacitor C2 and the output impedance of the circuit is adjusted by a second variable capacitor C3.

Figure 3:
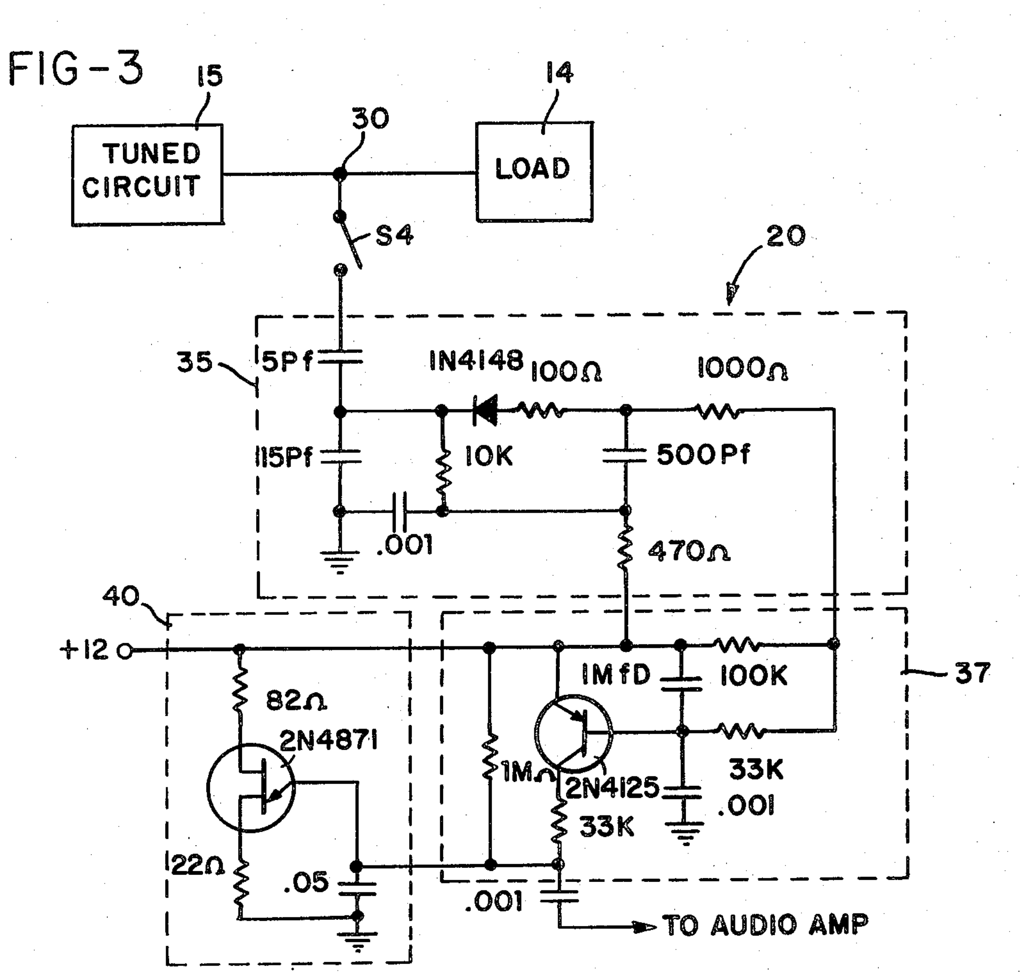
FIG. 3 is an electrical schematic of an audio frequency type output power detector.

The power output of the device is measured by a power output detector 20 which includes an audio frequency device shown in FIG. 3. The output audio frequency of the device is determined by the magnitude of the radio frequency voltage appearing at terminal 30. When the amplifier is adjusted to maximum power output, this RF voltage will be the maximum voltage available and will result in the highest (or lowest) frequency output from the audio amplifier as the capacitors C2 and C3 are adjusted through their ranges. By using an audio frequency device, the tuned circuit 15 may be adjusted quickly and without requiring the operator to monitor the equipment visually, which is especially useful in mobile operation or low ambient light conditions, or when the equipment is used by sightless operators. Of course, other types of output power detectors may be used, such as RF ammeters or relative power meters.

One form of audio frequency output power detector is shown in FIG. 3 and includes an RF detector 35 which provides a negative DC voltage output proportional to the RF voltage at terminal 30. This negative voltage output is applied to a variable resistor shown generally at 37. The variable resistor 37 is a transistorized circuit which decreases in resistance with an increase in negative voltage output from the RF detector circuit.

A unijunction transistor oscillator circuit 40 is provided and oscillates at an audio frequency determined by the variable resistor circuit 37. The unijunction oscillator provides an audio frequency output which, in the circuit shown in FIG. 3, increases in frequency as the power output or RF voltage at terminal 30 increases. Therefore, the operator merely adjusts the tuning and load capacitors C2 and C3 for maximum audio frequency output in order to tune the transmitter properly. This circuit is disconnected from terminal 30 by means of switch S4 when the power output is subsequently increased and the transmitter operated normally. In the embodiment shown in FIG. 2, switches S1, S2 and S4 are mechanically connected and operate simultaneously.

Figure 4:
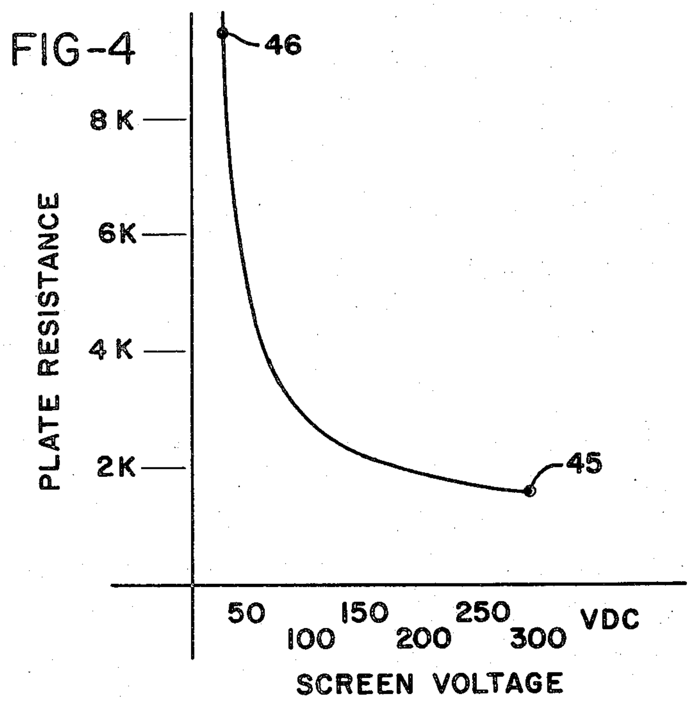
FIG. 4 is a graph showing the relationship between the optimum load resistance for the amplifier and screen voltage.

FIG. 4 is a curve showing the optimum load resistance for a typical vacuum tube amplifier with respect to the voltage applied to its screen electrode. With the screen voltage at its normal operating level, as shown at 45, the optimum load resistance for the tube is approximately 1,600 ohms. When the screen voltage is reduced to approximately 25 volts, the voltage applied during the initial tuneup upon the closure of switch S1, the optimum load resistance for the tube will increase to a value at point 46 in excess of 10K ohms. The temporary impedance 25 is therefore selected to approximate the optimum load resistance for the tube when operating at its normal power level (point 45) and is placed in parallel with the tube's output only during the low power level condition of operation. Since impedance of the tube is an order of magnitude greater than the impedance of the temporary resistance at this time, the effect of the tube's impedance on the total impedance presented to the input to circuit 15 is minimal.

By using the method and apparatus thus described, a transmitter may be tuned properly at very low power levels thus preventing damage thereto by excessive heat dissipation and reducing unnecessary signals.

While the method herein described, and the form of apparatus for carrying this method into effect, constitutes a preferred embodiment of the invention, it is to be understood that the invention is not limited to this precise method and form of apparatus, and that changes may be made in either without departing from the scope of the invention, which is defined in the appended claims.

What is claimed is:

1. Method of adjusting a tuned circuit which receives power from an amplifier and which transfers power to a load including the steps of lowering the power output of said amplifier thereby changing its characteristics, temporarily connecting an impedance device to the output of said amplifier, said impedance device approximating the optimum load impedance for said amplifier when operated at its normal power level, adjusting the tuned circuit for maximum output to said load at the lower power level, removing said temporary impedance device, and thereafter operating said amplifier at its normal power level without further need for adjustment of the tuned circuit.

2. The method of claim 1 further including the steps of converting the power output of the tuned circuit to an audible tone, the frequency of which is a function of power, while said amplifier is operating at the lower power level, and adjusting the tuned circuit for maximum power output by refernece to said tone.

3. Apparatus for adjusting a tuned circuit which receives power from an amplifier and which transfers power to a load including means for reducing the power output of the amplifier to a value substantially lower than its normal operating power level, a temporary impedance device having an impedance approximating the optimum load impedance for the amplifier when operated at its normal power level, means for connecting said temporary impedance device to the output of the amplifier, and means for measuring the power output of said tuned circuit when said amplifier is operated at its lower power level and when said temporary impedance is connected to the output of the amplifier so that the tuned circuit may be adjusted for maximum power output at the lower power level to provide for optimum adjustment of the tuned circuit when the amplifier is thereafter operated at its normal power level.

4. The apparatus of claim 3 wherein said amplifier is a radio frequency amplifier.

5. The apparatus of claim 3 wherein said temporary impedance device is a resistor.

6. The apparatus of claim 3 wherein said tuned circuit is a pi-network device.

7. The apparatus of claim 1 wherein said means for measuring the power output of said tuned circuit includes an audio frequency device which produces an audible output signal, the frequency of which is a function of the power output of said circuit.

8. In a circuit including an amplifier, a tuned circuit for receiving power from said amplifier and for transferring said power to a load, and means for coupling said tuned circuit to said amplifier, the improvement comprising a temporary impedance device having an impedance approximating the optimum load impedance for the amplifier when operated at its normal power level, means for connecting said temporary impedance device to the output of said amplifier, means for simultaneously reducing the output power level of said amplifier to a fraction of its normal power level, and means for measuring the power output of said tuned circuit to said load.

* * * * *